United States Patent
Irukuvajhula et al.

(10) Patent No.: US 11,223,716 B2
(45) Date of Patent: Jan. 11, 2022

(54) ADAPTIVE VOLUME CONTROL USING SPEECH LOUDNESS GESTURE

(71) Applicant: Polycom, Inc., San Jose, CA (US)

(72) Inventors: Subramanyam Irukuvajhula, Hyderabad (IN); Ravi Kiran Nalla, Hyderabad (IN); Satyanarayana Mantri, Hyderabad (IN)

(73) Assignee: Polycom, Inc., San Jose, CA (US)

(*) Notice: Subject to any disclaimer, the term of this patent is extended or adjusted under 35 U.S.C. 154(b) by 912 days.

(21) Appl. No.: 15/980,528

(22) Filed: May 15, 2018

(65) Prior Publication Data
US 2019/0306297 A1 Oct. 3, 2019

(30) Foreign Application Priority Data

Apr. 3, 2018 (IN) .............................. 201831012695

(51) Int. Cl.
| | | |
|---|---|---|
| H03G 1/02 | (2006.01) | |
| H04M 1/60 | (2006.01) | |
| H04M 9/08 | (2006.01) | |
| H03G 3/20 | (2006.01) | |

(52) U.S. Cl.
CPC ......... H04M 1/6033 (2013.01); H04M 9/082 (2013.01); H03G 3/20 (2013.01)

(58) Field of Classification Search
CPC ........ G10L 21/0208; H03G 1/02; H03G 3/20; H04L 65/403; H04M 1/6033; H04M 3/002; H04M 9/082
USPC ... 379/56.3, 388.03, 390.01, 390.03, 406.01, 379/406.08, 420.01, 388.05; 381/57, 60, 381/66, 71, 1, 96, 107, 111, 120, 312, 381/375, 59, 71.1, 71.6, 74, 92; 455/355; 700/94; 330/278; 704/225

See application file for complete search history.

(56) References Cited

U.S. PATENT DOCUMENTS

| | | | | |
|---|---|---|---|---|
| 4,490,584 A | * | 12/1984 | Lucey | H04M 1/737 379/56.3 |
| 4,625,083 A | * | 11/1986 | Poikela | G10L 25/78 367/199 |
| 5,553,151 A | * | 9/1996 | Goldberg | H03G 7/002 381/312 |
| 5,666,426 A | | 9/1997 | Helms | |
| 5,790,671 A | * | 8/1998 | Cooper | H03G 9/005 381/57 |

(Continued)

OTHER PUBLICATIONS

Samira Tungare, Edward Harper, Sarah Kolak, "Self-Adjusting Speakers," University of Illinois Urbana-Chapaign, The Grainger College of Engineering, ECE 445, Spring 2020, https://courses.physics.illinois.edu/ece445/getfile.asp?id=16794.

*Primary Examiner* — Gerald Gauthier
(74) *Attorney, Agent, or Firm* — Keith Lutsch PC

(57) ABSTRACT

A conferencing endpoint includes a loudspeaker component, a base microphone, and an adaptive volume control module which evaluates near-end audio conditions at a conferencing endpoint and automatically determines whether to change the audio volume at a near-end loudspeaker. The endpoint can, for example, detect that a person speaking into the base microphone has begun to speak more loudly to compensate for nearby background noise. The endpoint can automatically adjust the loudspeaker volume or provide an alert that the loudspeaker will be changed, giving the user the opportunity to accept or decline an increase in speaker volume.

12 Claims, 5 Drawing Sheets

(56) References Cited

U.S. PATENT DOCUMENTS

| | | | | |
|---|---|---|---|---|
| 5,966,438 A * | 10/1999 | Romesburg | H04M 9/08 | 379/388.03 |
| 6,216,052 B1 * | 4/2001 | Gulick | H03F 1/0211 | 381/94.5 |
| 6,496,581 B1 * | 12/2002 | Finn | H04M 9/082 | 379/406.01 |
| 7,079,645 B1 * | 7/2006 | Short | H04M 1/6016 | 379/388.03 |
| 7,366,296 B2 * | 4/2008 | Benco | H04M 1/60 | 379/388.03 |
| 7,760,869 B2 * | 7/2010 | Ray | H03G 7/004 | 379/420.01 |
| 7,764,783 B1 * | 7/2010 | Pai | H04M 9/082 | 379/406.08 |
| 8,335,324 B2 * | 12/2012 | Zhang | H03G 3/32 | 381/107 |
| 8,335,685 B2 * | 12/2012 | Hetherington | G10L 21/0208 | 704/225 |
| 8,483,409 B2 * | 7/2013 | Campion | H04M 1/6016 | 381/107 |
| 8,744,091 B2 * | 6/2014 | Chen | G10L 21/0364 | 381/57 |
| 9,344,049 B2 * | 5/2016 | Desmarais | H03G 1/02 | |
| 9,380,150 B1 * | 6/2016 | Bullough | H04M 1/60 | |
| 9,479,650 B1 * | 10/2016 | Gunther | H04B 3/237 | |
| 10,154,148 B1 * | 12/2018 | Chu | H04M 3/002 | |
| 2002/0076037 A1 * | 6/2002 | Nishimura | H04M 9/082 | 379/406.01 |
| 2002/0086656 A1 * | 7/2002 | Mattisson | H04M 1/605 | 455/355 |
| 2002/0141601 A1 * | 10/2002 | Finn | H04R 3/005 | 381/92 |
| 2003/0021408 A1 * | 1/2003 | Mauney | H04M 1/60 | 379/390.01 |
| 2003/0091180 A1 * | 5/2003 | Sorqvist | H04M 9/082 | 379/390.03 |
| 2005/0190927 A1 * | 9/2005 | Petroff | H03G 3/32 | 381/59 |
| 2007/0009122 A1 * | 1/2007 | Hamacher | H04R 25/453 | 381/312 |
| 2007/0127709 A1 * | 6/2007 | Takahashi | H04M 1/6033 | 379/388.03 |
| 2007/0230712 A1 * | 10/2007 | Belt | G10L 21/0208 | 381/71.1 |
| 2007/0262819 A1 * | 11/2007 | Jin | H04M 1/6008 | 330/278 |
| 2008/0019539 A1 * | 1/2008 | Patel | H04R 3/00 | 381/96 |
| 2008/0187160 A1 * | 8/2008 | Kim | G08C 19/00 | 381/375 |
| 2009/0214048 A1 * | 8/2009 | Stokes, III | H04M 9/082 | 381/66 |
| 2009/0232320 A1 * | 9/2009 | Azizi | G10L 21/0208 | 381/57 |
| 2010/0040240 A1 * | 2/2010 | Bonanno | H04S 1/005 | 381/74 |
| 2010/0142716 A1 * | 6/2010 | Lee | H04R 27/00 | 381/57 |
| 2011/0026739 A1 * | 2/2011 | Thomsen | H03F 3/68 | 381/120 |
| 2011/0093102 A1 * | 4/2011 | Aichner | H04M 9/082 | 700/94 |
| 2013/0129117 A1 * | 5/2013 | Thomsen | H04R 3/00 | 381/111 |
| 2014/0369527 A1 * | 12/2014 | Baldwin | H03G 3/20 | 381/107 |
| 2015/0222999 A1 * | 8/2015 | Rasmussen | A61B 5/123 | 381/60 |
| 2016/0063988 A1 * | 3/2016 | Hendrix | H04R 1/1083 | 381/71.6 |
| 2018/0041639 A1 * | 2/2018 | Gunawan | G10L 21/02 | |
| 2018/0220007 A1 * | 8/2018 | Sun | H04M 9/082 | |
| 2019/0306297 A1 * | 10/2019 | Irukuvajhula | H04M 1/6033 | |

\* cited by examiner

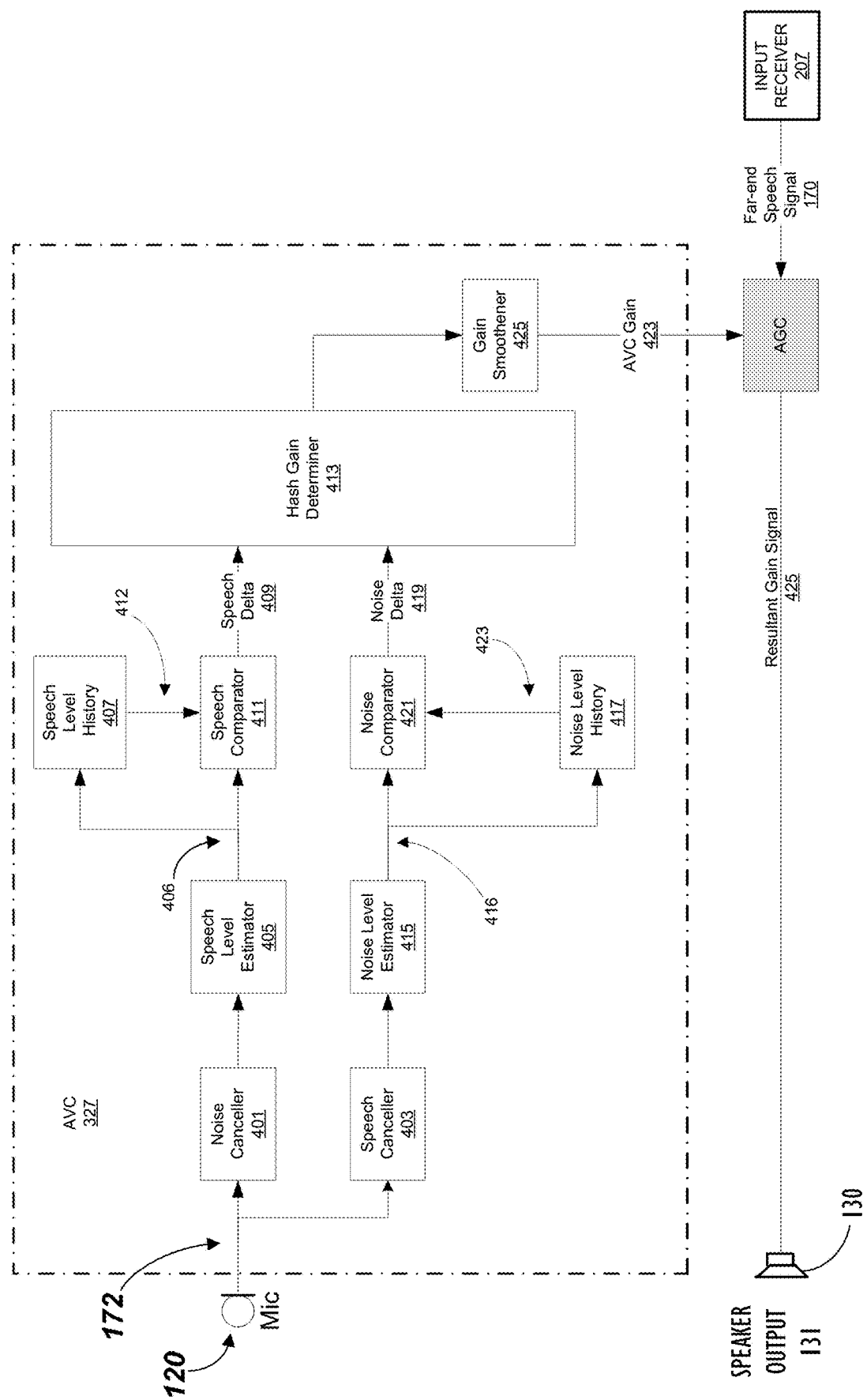

ADAPTIVE VOLUME CONTROL USING SPEECH LOUDNESS GESTURE

CROSS-REFERENCE TO RELATED APPLICATION

This application claims priority benefit of India provisional application no. 201831012695, filed Apr. 3, 2018 and entitled Adaptive Volume Control Using Speech Loudness Gesture, the contents of which are entirely incorporated by reference herein. This application is related to U.S. patent application Ser. No. 15/667,910, filed Aug. 3, 2017 and entitled Audio Echo Cancellation with Robust Double-Talk Detection in a Conferencing Environment, the contents of which are entirely incorporated by reference herein.

FIELD OF TECHNOLOGY

This disclosure pertains generally to the field of adjusting loudspeaker volumes at a conferencing endpoint, and pertains in particular to adaptively controlling loudspeaker volume based on audio conditions at a conferencing endpoint.

BACKGROUND

Conferencing endpoints enable people to talk to each other over networks. When a person at one endpoint cannot hear a talker at a remote endpoint very well, the person can manually adjust the volume of the loudspeaker near the person so they can hear the talker better.

SUMMARY

A conferencing endpoint emits audio received from a remote endpoint using a loudspeaker component. The conferencing endpoint can detect that a person speaking into a base microphone has begun to speak more loudly, such as to compensate for nearby background noise. The conferencing endpoint can automatically adjust the loudspeaker volume, obviating the need for the person to manually change the volume of their loudspeaker.

BRIEF DESCRIPTION OF THE DRAWINGS

FIG. 4 illustrates an Adaptive Volume Control module of a conferencing endpoint in accordance with an embodiment of this disclosure.

DETAILED DESCRIPTION

Figure 1:
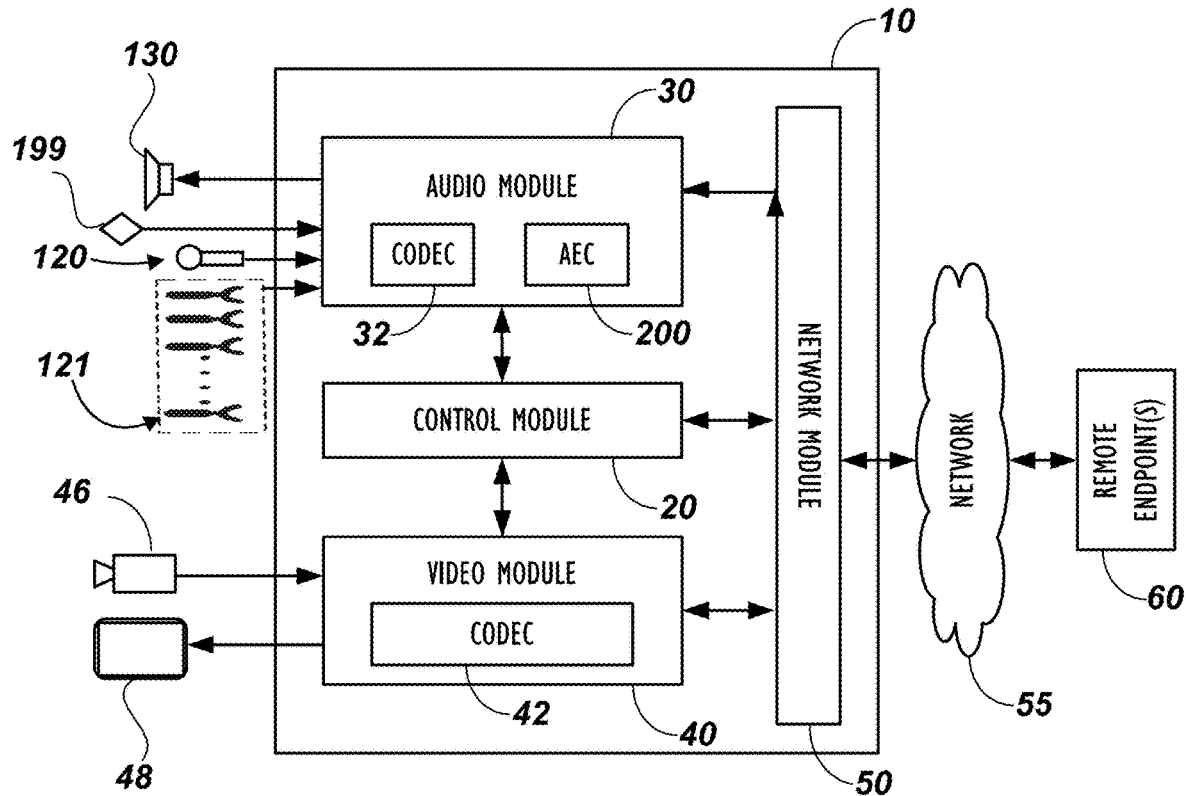
FIG. 1 illustrates a conferencing endpoint in accordance with an embodiment of this disclosure.

Videoconferencing and teleconferencing utilize various means for setting and controlling loudspeaker volume. When a conference participant is unable to adequately hear a far-end talker, that participant can actuate one or more inputs to raise the volume coming out of a near-speaker. However, this solution is not optimal.

Terms

Throughout this disclosure, the following terms have the following meanings, unless indicated otherwise.

A conferencing endpoint is an electronic device or set of devices configured to broadcast audio received from a remote source and capture nearby audio for transmission to a remote device. Conferencing endpoints include, but are not limited to mobile phones, table top computers, teleconferencing devices, headphone-microphone combinations, earphone-microphone combinations, and walkie-talkies.

The Real-time Transport Protocol (RTP) is a network protocol for delivering audio and video over IP networks. RTP is used extensively in communication and entertainment systems that involve streaming media, such as telephony, video teleconference applications including WebRTC, television services and web-based push-to-talk features. RTP is one of the technical foundations of Voice over IP and in this context is often used in conjunction with a signaling protocol such as the Session Initiation Protocol (SIP) which establishes connections across the network. RTP was developed by the Audio-Video Transport Working Group of the Internet Engineering Task Force (IETF) and first published in 1996 as RFC 1889, superseded by RFC 3550 in 2003, the contents of which are entirely incorporated by reference herein.

Gain is a measure of the ability of a two-port circuit (often an amplifier) to increase the power or amplitude of a signal from the input to the output port by adding energy converted from some power supply to the signal. Gain is the mean ratio of the signal amplitude or power at the output port to the amplitude or power at the input port. Gain can be expressed using the logarithmic decibel (dB) units ("dB gain").

Embodiments of this disclosure include a conferencing endpoint with at least one microphone configured to capture a user's speech input (voice) for transmission to a far-end endpoint over a communications network, and at least one loudspeaker component used to render speech received over a network of a far-end talker.

Embodiments of this disclosure are directed toward adaptively and automatically controlling the volume of the loudspeaker based on change in the speech loudness of a near-end participant. In at least one embodiment, a change in the speech loudness of a near-end participant volume can occur in response to a change in ambient noise in the near-end participant's vicinity. Embodiments of this disclosure are directed toward adaptively and automatically controlling the volume of a near-end loudspeaker when one or more people are engaged in a conversation with a far-end conference participant.

In an embodiment of this disclosure, an endpoint has a microphone that captures audio which includes a user's speech input and any ambient noise if any. By way of description, not of limitation, the captured audio is digitized as a microphone signal. The microphone signal passes through an equalizer, and is then input to a speech enhancement block. The speech enhancement module processes the input microphone signal. The speech enhancement module, a/k/a the Digital Signal Processing (DSP) module can include various (sub)modules, such as a Voice Activity Detection (VAD) module, which is used to detect the speech activity of near-end talker. The DSP module can also include an Active Noise Cancellation (ANC) module, which is used to filter ambient noise captured by the microphone, and allows only the user's speech to reach the far-end. The DSP module can also include an Acoustic Echo Cancellation (AEC) module which is used to filter any far-end speech emitted by a near-end loudspeaker and captured by the microphone. (See U.S. patent application Ser. No. 15/667,910.) After being processed by the DSP module, the microphone signal passes to an encoder. The encoder can be included within an encoder/decoder (Codec) module. The encoder encodes processed microphone signal. The encoded microphone signal is then input to a packetizing (PKT) module. The PKT module converts the encoded microphone signal into Real-time Transport Protocol (RTP) packets, and transmits RTP packets to far-end endpoint. Transmission can occur over one or more networks.

In at least one embodiment of this disclosure, an endpoint can receive an audio signal from a remote endpoint. The received far-end signal can come through one or more networks. The received far-end signal can be in the form of encoded RTP audio packets. The received far-end signal can be input to an Adaptive Jitter Buffer (AJB) module. The AJP module can be included with or be separate from the PKT module. The AJB block compensates for any missed RTP packets, and functions to nullify or eliminate jitter in the incoming (far-end) signal. The output of the AJB is received by a decoder module of the Codec, which decodes the far-end signal. The decoded far-end signal is then passed to an Adaptive Gain Control (AGC) module. The AGC module controls the gain of the received far-end signal, which is then received by the loudspeaker component. The loudspeaker component emits audio output (sound) in accordance with the far-end signal that the loudspeaker component receives from the AGC module. In at least one embodiment, the AGC module applies a smoothing algorithm to the far-end signal to prevent or minimize abrupt changes to the gain value of the loudspeaker, which can cause sudden changes in volume coming out of the loudspeaker.

In at least one embodiment of this disclosure, an endpoint also includes an Adaptive Volume Control (AVC) module. An AVC module can be included within the DSP module. The AVC module can be configured to receive the microphone signal directly or indirectly from the microphone. The AVC module determines an AVC Gain signal, which is sent to the AGC module. The AGC module sums the gain value of the AVC gain signal with the gain value of the far-end signal received from decoder module, resulting in a Resultant Gain value. The Resultant Gain value is used to control the gain of the loudspeaker. Since the audio captured by the microphone includes both a talker's voice and any ambient noise, both components are included in the signal received by the AVC from the microphone, and both are used in determining the value of the AVC Gain. This described use of the ambient noise signal picked up (captured) by the microphone contrasts with conventional systems in which such noise is simply filtered, (such as by an ANC module).

FIG. 1 illustrates a conferencing apparatus or endpoint 10 in accordance with an embodiment of this disclosure. Conferencing apparatus or endpoint 10 of FIG. 1 communicates with one or more remote endpoints 60 over a network 55. The endpoint 10 includes an audio module 30 with an audio codec 32, and a video module 40 with a video codec 42. These modules 30/40 operatively couple to a control module 20 and a network module 50. In implementations of the technology which only involve audio communication, video module 40 with a video codec 42 can be omitted.

A microphone 120 captures audio and provides the audio to the audio module 30 and codec 32 for processing. The microphone 120 can be a table or ceiling microphone, a part of a microphone pod, an integral microphone to the endpoint, or the like. Additional microphones 121 can also be provided. Throughout this disclosure all descriptions relating to microphone 120 apply to any additional microphones 121, unless otherwise indicated. The endpoint 10 uses the audio captured with the microphone 120 primarily for the conference audio. In general, the endpoint 10 can be a conferencing device, a videoconferencing device, a personal computer with audio or video conferencing abilities, or any similar type of communication device. If the endpoint 10 is used for videoconferencing, a camera 46 captures video and provides the captured video to the video module 40 and codec 42 for processing.

After capturing audio and video, the endpoint 10 encodes it using any of the common encoding standards, such as for example, MPEG-1, MPEG-2, MPEG-4, H.261, H.263, H.264, AAC, AC-3. ALAC, ALS, G.722.1, G.722.2, and WMA. Then, the network module 50 outputs the encoded audio and video to the remote endpoints 60 via the network 55 using any appropriate protocol. Similarly, the network module 50 receives conference audio and video via the network 55 from the remote endpoints 60 and sends these to their respective codec 32/42 for processing. Eventually, a loudspeaker component 130 outputs conference audio (received from a remote endpoint), and a display 48 can output conference video. The endpoint 10 includes a distortion detection module 199 for detecting distortion that may be introduced when the loudspeaker component 130 outputs audio. Many of these modules and other components can operate in a conventional manner well known in the art so that further details are not provided here.

The endpoint 10 further includes an acoustic echo cancellation module 200 that reduces acoustic echo. As is known, acoustic echo results from far-end audio output of the loudspeaker 130 being subsequently picked up by the local microphone 120, reprocessed, and sent back to the far-end. Additional microphones 121 can operate by the same principle. The acoustic echo cancellation module 200 can be based on acoustic echo cancellation techniques known and used in the art to reduce or eliminate this form of echo. For example, details of acoustic echo cancellation can be found in U.S. Pat. Nos. 5,263,019 and 5,305,307, which are incorporated herein by reference in their entireties, although any other number of available sources have details of acoustic echo cancellation. The acoustic echo cancellation module 200 can include a double-talk detection unit (not shown), the purpose of which is to determine when persons/speakers are talking at the nearend (at endpoint 10) and people are talking at a remote endpoint 10 simultaneously. In that situation, the endpoint 10 can allow audio from the near end and far-end to pass to the other. In simple terms, the double-talk detection unit compares the energy of an audio signal received from a remote endpoint 60 with the energy in the audio signal coming from microphone 120. When the double-talk detection unit determines that the two energies are relative to one another in a predetermined relationship (for example near end energy is twice that received from the far-end), the detection unit determines that double-talk is present. That is, the double talk detection unit of the AEC 309 determines that persons at the near end (10) and persons at the far-end are speaking substantially simultaneously. Distortion introduced by the loudspeaker 130, however, affects the performance of the double-talk detection unit, as will be discussed in greater detail below. As noted, determining the energy corresponding to the distortion coming from loudspeaker 130 can improve the performance of one or more double-talk detection units of microphones 120, 121.

Figure 2:
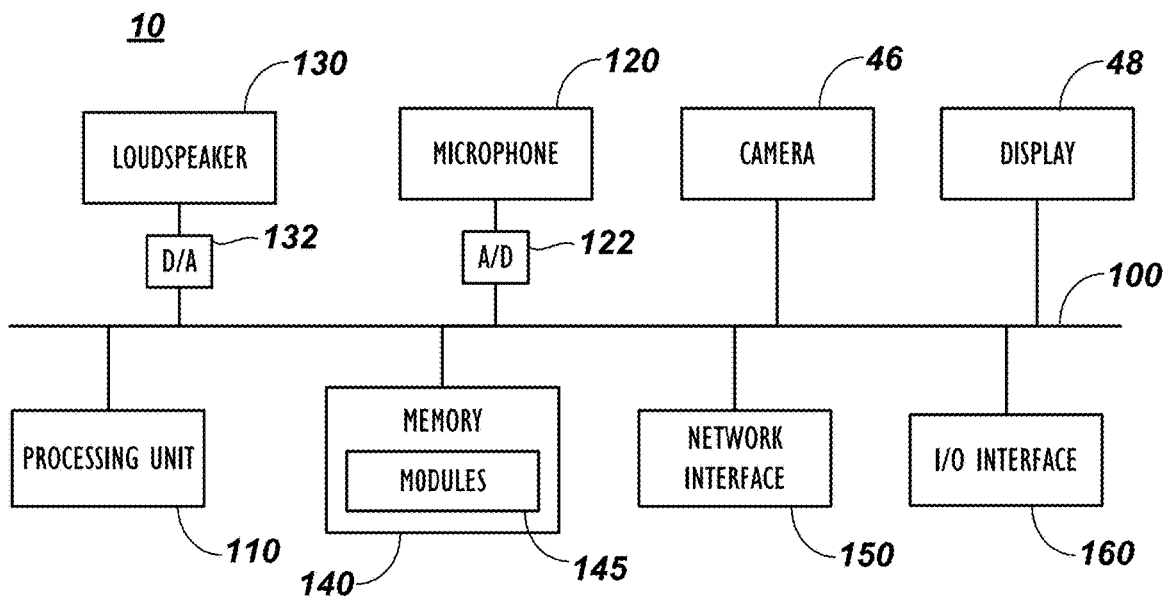
FIG. 2 illustrates components and aspects of the conferencing endpoint of FIG. 1 in detail.

FIG. 2 illustrates components of the conferencing endpoint of FIG. 1 in detail. The endpoint 10 has a processing unit 110, memory 140, a network interface 150, and a general input/output (I/O) interface 160 coupled via a bus 100. As above, the endpoint 10 has the base microphone 120 and loudspeaker 130 and can have the video components of a camera 46 and a display 48 if desired.

The memory 140 can be any conventional memory such as SDRAM and can store modules 145 in the form of software and firmware for controlling the endpoint 10. The stored modules 145 include the various video and audio codecs 32/42 and other modules 20/30/40/50/200 discussed previously. Moreover, the modules 145 can include operating systems, a graphical user interface (GUI) that enables users to control the endpoint 10, and other algorithms for processing audio/video signals.

The network interface 150 provides communications between the endpoint 10 and remote endpoints (60). By contrast, the general I/O interface 160 can provide data transmission with local devices such as a keyboard, mouse, printer, overhead projector, display, external loudspeakers, additional cameras, microphones, etc.

During operation, the loudspeaker 130 outputs audio in the conference environment. For example, this output audio can include far-end audio received from remote endpoints via the network interface 150 and processed with the processing unit 110 using the appropriate modules 145. At the same time, the microphone 120 captures audio in the conference environment and produces audio signals transmitted via the bus 100 to the processing unit 110.

For the captured audio, the processing unit 110 processes the audio using algorithms in the modules 145. In general, the endpoint 10 processes the near-end audio captured by the microphone 120 and the far-end audio received from the transmission interface 150 to reduce noise and cancel out acoustic echo that may occur between the captured audio. Ultimately, the processed audio can be sent to local and remote devices coupled to interfaces 150/160.

In particular, the endpoint 10 uses the acoustic echo canceller 200 of FIG. 1 that can operate on the signal processor 110. The acoustic echo canceller 200 removes the echo signal from the captured near-end signal that may be present due to the loudspeaker 130 in the conference environment.

As shown in FIG. 2, the microphone 120 uses an analog-to-digital (A/D) converter 122 that runs off a clock 124. The loudspeaker 130 by contrast uses a digital-to-analog (D/A) converter 132. When attempting to ameliorate the effects of distortion in the loudspeaker 130 and background noise collected by the microphone, audio, digital and analog gain of each component may need to be taken into account.

Figure 3A:
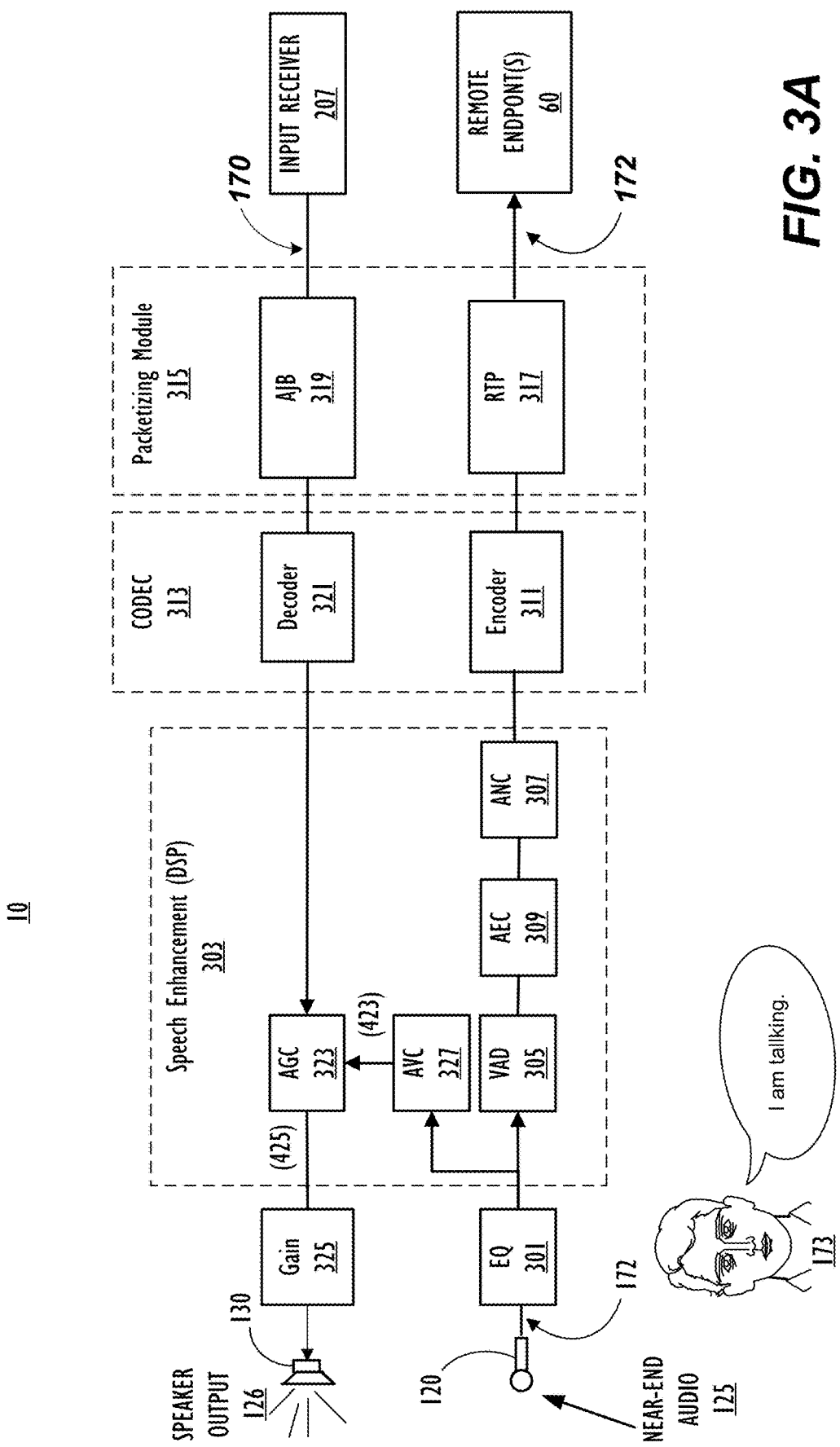
FIG. 3A illustrates further components and aspects of the conferencing endpoint of FIG. 1 in a first configuration.

FIG. 3A illustrates additional aspects of an endpoint 10 in accordance with this disclosure. As noted, the endpoint 10 includes a microphone 120 that captures audio 110 which includes a user's speech input and any ambient noise. By way of description, not of limitation, the captured audio 125 is digitized as a microphone signal 172. The microphone signal 172 passes through an equalizer 301, and is then input to a speech enhancement module 303. The speech enhancement module 303 processes the input microphone signal 172. The speech enhancement module 303, a/k/a the Digital Signal Processing (DSP) module 303 includes various (sub) modules, such as a Voice Activity Detection (VAD) module 305, which is used to detect the speech activity of near-end talker 173. The DSP module 303 can also include an Active Noise Cancellation (ANC) module 307, which is used to filter ambient noise captured by the microphone, and allows only the user's speech to reach the far-end 60. The DSP module 303 can also include an Acoustic Echo Cancellation (AEC) module 309 (200) which is used to filter any far-end speech emitted 126 by the near-end loudspeaker 130 and captured by the microphone 120. After being processed by the DSP module, the microphone signal 172 passes to encoder 311. The encoder 311 can be included within an encoder/decoder (Codec) module 313.

The encoder 311 encodes the processed microphone signal 172 which it receives from the DSP module 303. The encoded microphone signal 172 is then input to a packetizing (PKT) module 315. The PKT module 315 converts the encoded microphone signal 172 into Real-time Transport Protocol (RTP) packets at RTP module 317, and transmits RTP packets to far-end endpoint 60. Transmission can occur over one or more networks, (see FIG. 1). The endpoint 10 can receive an audio signal 170 from a remote endpoint 60 at an input receiver 207. The received far-end signal 170 can come through one or more networks, (see FIG. 1). The received far-end signal 170 can be in the form of encoded RTP audio packets. The received far-end signal 170 can be input to an Adaptive Jitter Buffer (AJB) module 319. The AJB module 319 can be included with, or be separate from, the PKT module 315. The AJB module 319 compensates for any missed RTP packets, and nullifies or eliminates jitter in the incoming (far-end) signal 170. The output of the AJB module 319 is received by a decoder module 321 of the Codec 313, which decodes the far-end signal 170. The decoded far-end signal 170 is then passed to an Adaptive Gain Control (AGC) module 323. The AGC module 323 controls the gain of the received far-end signal 170, which is then received by the loudspeaker 130. The loudspeaker 130 emits audio output (sound) in accordance with the far-end signal 170 that the loudspeaker 130 receives from the AGC module 323. In some embodiments, the AGC module 323 applies a smoothing algorithm to the far-end signal 170 to prevent or minimize abrupt changes to the gain value 325 of the loudspeaker 130, which can cause sudden and annoying changes in volume of loudspeaker output 126.

The endpoint 10 illustrated in FIG. 3A also includes an Adaptive Volume Control (AVC) module 327. An AVC module 327 can be included within the DSP module 303. The AVC module 327 can be configured to receive the microphone signal 172 directly or indirectly from the microphone 120. The AVC module 327 determines an AVC Gain signal 423, which is sent to the AGC module 323. The AGC module 323 sums the gain value of the AVC gain signal 423 with the gain value of the far-end signal 170 received from decoder module 321, resulting in a Resultant Gain value 425. The Resultant Gain value 425 is used to control the gain 325 of the loudspeaker 126. Since the audio 125 captured by the microphone 120 includes both a talker's voice and any ambient noise, both components (corresponding to a linear portion and a non-linear portion, respectively) are included in the signal 127 received by the AVC module 327 from the microphone 120 (via the equalizer 301), and both are used in determining the value of the AGC Gain 425. The endpoint 10 illustrated in FIG. 3A can thus automatically adjust the volume 126 of the loudspeaker 130 when the endpoint detects that a person speaking into the microphone has raised their voice, or whether there is background noise/chatter, or both.

Figure 3B:
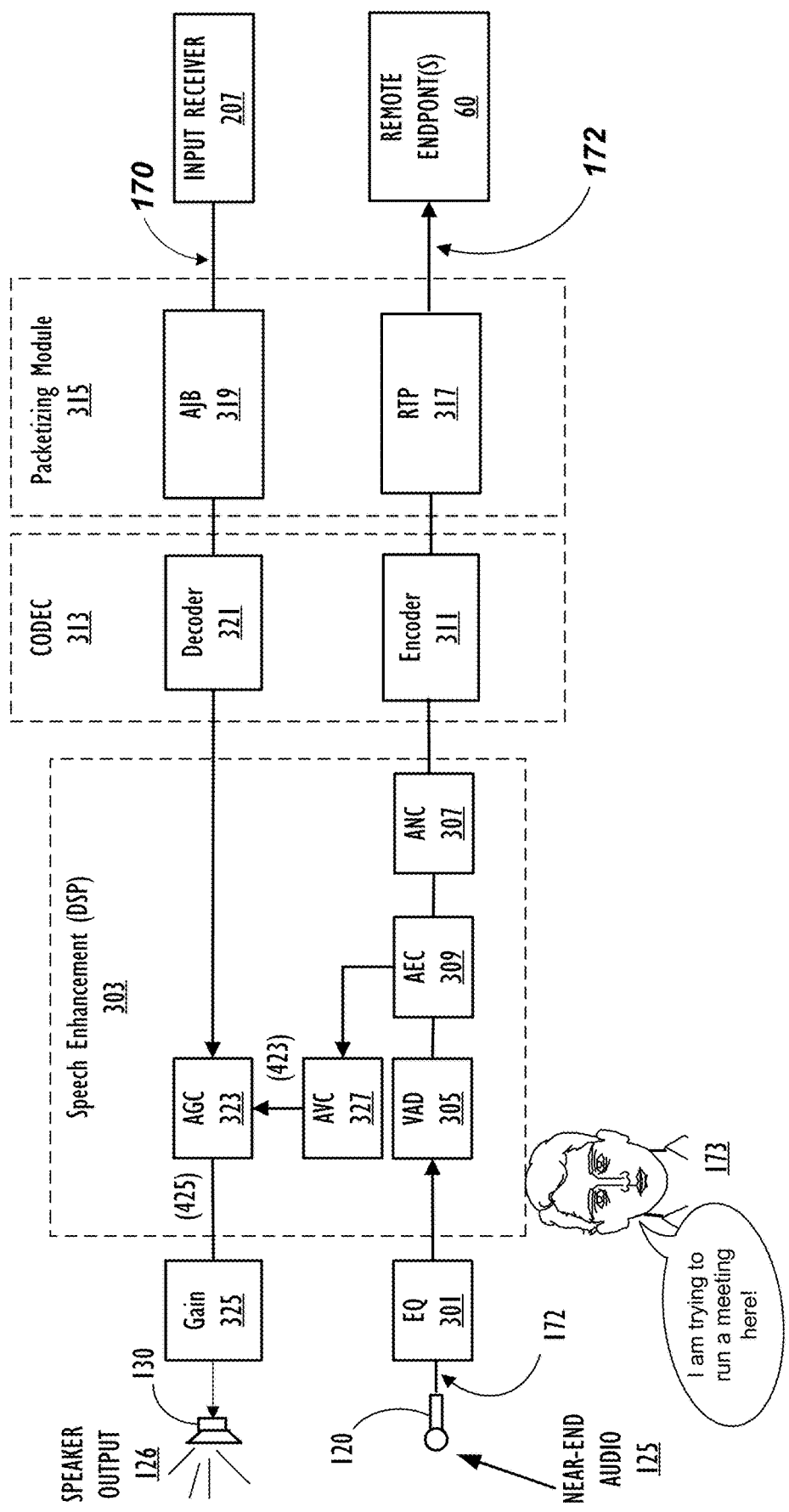
FIG. 3B illustrates further components and aspects of the conferencing endpoint of FIG. 1 in an alternate configuration.

FIG. 3B illustrates an alternate configuration of the components illustrated in FIG. 3A. FIG. 3B is the same as FIG. 3A except that in FIG. 3B, microphone signal 172 passes through VAD 305 and AEC 309 before microphone signal 172 is received by AVC 327.

Speech Delta Calculation

FIG. 4 illustrates an AVC module 327 in accordance with an embodiment of this disclosure. As discussed above, the microphone 120 captures audio 125 and sends a corresponding microphone signal 172 to, amongst other components, the AVC module 327. The AVC module 327 includes various sub-modules, as shown. The microphone signal 172 is input in parallel to a noise cancellation module 401 and a speech cancellation module 403. Noise cancellation module separates the ambient noise from the microphone signal 172. The microphone signal 172, which now includes only a speech portion corresponding to the talker's voice, is passed to the Speech Level Estimator module 405. The 'Speech Level Estimator' module determines the active speech level of the microphone signal 172 received from Noise Cancellation module 401. A current speech level value 406 is sent to the Speech Level History module 407 in which it is cached for future use. The number of samples required to be stored depends on the precision/accuracy requirement of the Speech Delta 409 which will be discussed below. The value of the active speech level 406 is also passed to the Comparator module 411 which compares the current sample 406 with the average value 412 of the samples stored in the Speech Level History module 407 to compute the Speech Delta 409 which is then passed to the Hash Gain Determination module 413, which is explained in detail below.

Noise Delta Calculation

As noted above, the microphone signal 172 is sent to Speech Cancellation module 403 which filters out the speech component of the microphone signal 172 corresponding to the talking sounds coming from a person speaking into the microphone 120. The near-end signal 172, which contains only a noise portion, corresponding to background noise captured by the microphone 120, is passed to the Noise Level Estimation module 415. The Noise Level Estimation module 415 estimates the active noise level based on the noise portion of the near-end signal 172 from the noise signal. The estimation module 415 sends an active noise value signal 416 to the Noise Level History module 417 in which it is cached for future use. The number of samples of active noise values required to be stored is dictated by the desired precision/accuracy requirement of the Noise Delta 419, which will be explained in detail below. The active noise level 416 is also passed to the Noise Comparator module 421 which compares the current value 416 of the noise level with the average value 423 of the samples stored in the Noise Level History module 417 to compute the Noise Delta 419. Like the Speech Delta 409, the Noise Delta 419 is transmitted to the Hash Gain Determination module 413.

Hash Gain Table

The Noise Delta 419 and Speech Delta 409 are passed to the Hash Gain Determination (HGD) module 413. The HGD module 413 determines whether, and by how much, the gain of the loudspeaker 130 should be revised. The method by which the HGD module makes this determination is qualitatively set forth in Table 1, shown below. Based on this determination, the HGD module 413 emits an AVC gain signal 423.

TABLE 1

| Speech Delta | Noise Delta | AVC Gain |
| --- | --- | --- |
| Increase | No change | No change |
| Increase | Increase | Significant Increase |
| No change | Increase | Increase |
| No change | No change | No change |

TABLE 1-continued

| Speech Delta | Noise Delta | AVC Gain |
| --- | --- | --- |
| Decrease | No change | No change |
| Decrease | Decrease | Significant Decrease |
| No change | Decrease | Marginal Decrease |

The AVC gain signal 423 can pass through a Gain Smoothening module 425 which modulates the AVC gain signal 423 so as to minimize sudden exaggerated changes to the loudspeaker output volume 131. The AVC gain signal 423 is received by the AGC where it is summed with the gain of the received far-end signal 170 to generate a resultant gain 425 which used, as discussed with reference to FIG. 3, to modify the gain (325) of the loudspeaker 130.

Figure 5:
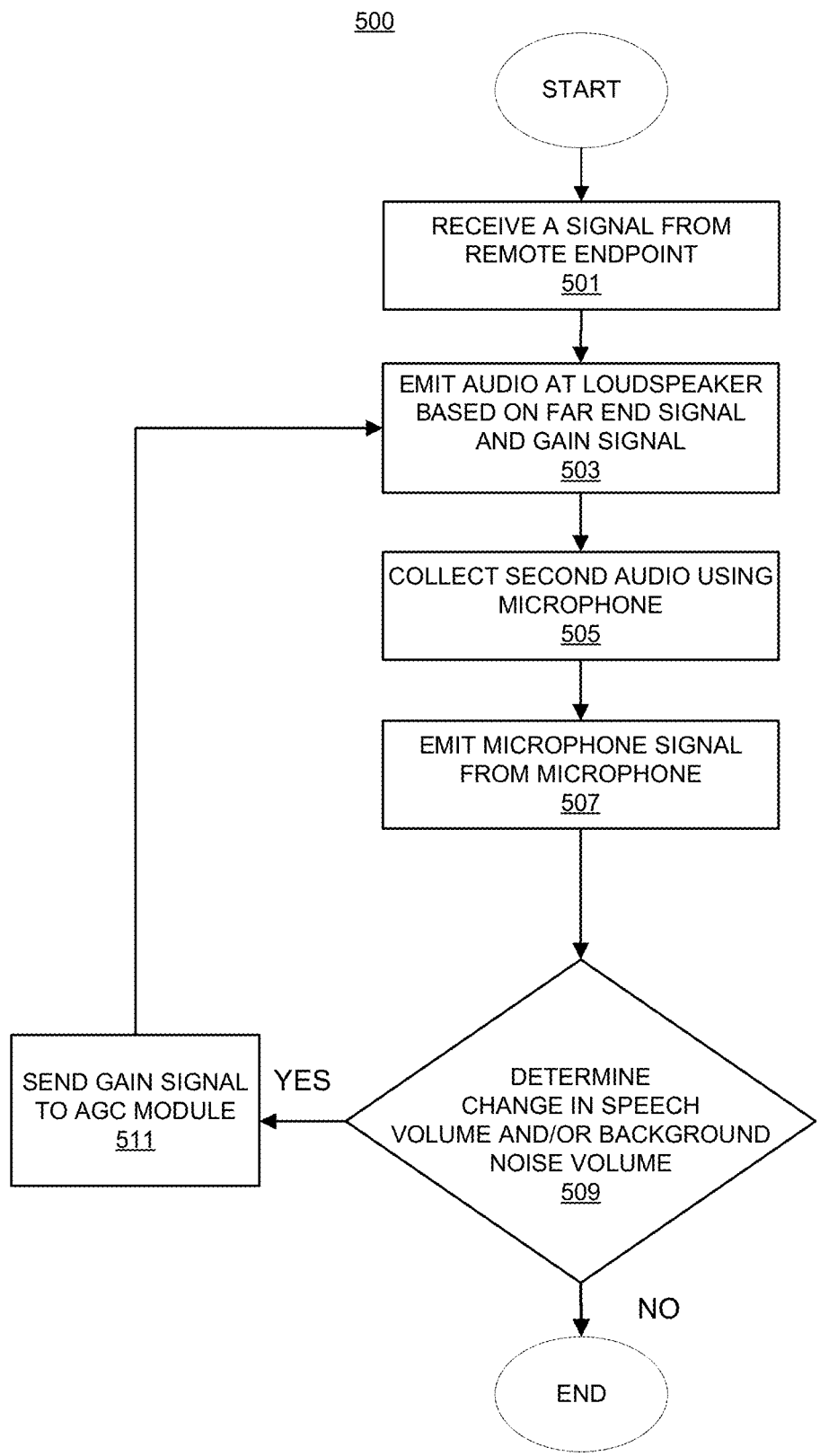
FIG. 5 illustrates a method of adaptively controlling loudspeaker volume of a conferencing endpoint in accordance with an embodiment of this disclosure.

FIG. 5 illustrates a method in accordance with an embodiment of this disclosure. The method 500 begins when a first signal (see 170, FIGS. 3A-3B) is received 501 from a remote endpoint (60). The first signal (170) can include a first linear portion associated with a first energy value. Audio (126) is then emitted 503 at a loudspeaker, based on the first signal (170). Audio (125) is also collected 505 by a microphone (120). The audio (120) collected 505 by the microphone (120) includes a speech component corresponding to speech of a near-end talker (173). A signal (172) is then emitted 507 by the microphone (120) which includes a second linear portion corresponding to the speech component of the collected second audio (125). The second linear portion is associated with a second energy value, in this case the energy corresponding to a person (173) speaking into the microphone. A determination 509 is then made as to whether the energy value of the linear portion of the microphone signal (172) satisfies one or more criteria, (see Table 1), such as whether the person (173) speaking into the microphone (120) has begun to talk louder because of the speaker's environment has become noisier. Depending on the determination 509, a gain signal (423) may be sent to the AGC module 323 which will control the gain of the loudspeaker (130) based, at least in part, on the gain signal (423).

The techniques of the present disclosure can be implemented in digital electronic circuitry, computer hardware, firmware, software, or any combinations of these. Aspects of the disclosed techniques can be implemented in a program storage device, computer-readable media, or other tangibly embodied machine-readable storage device for execution by a programmable control device. The disclosed techniques can be performed by a programmable processor executing program instructions to perform functions of the disclosed techniques by operating on input data and generating output. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

For Audio/Video endpoints equipped with multiple microphones deployed for the purpose of sensing the ambient noise and aid the ANC processing, the inputs from these microphones can also be considered along with the ambient noise picked up by the main microphone in order to achieve precise 'Noise Delta' calculation. The teachings of this disclosure are not limited to simple endpoints but can be used by any type of an endpoint capable of performing DSP or having access to DSP functionality.

Additional Embodiments of this Disclosure Include the Following Examples:

A. A method of adaptively controlling loudspeaker volume at a conferencing endpoint, the method comprising: receiving a first signal from a remote endpoint, the first signal including a first linear portion associated with a first energy value; emitting first audio at a loudspeaker, the first audio based on the first signal; collecting second audio using a first microphone, wherein the second audio includes a speech component corresponding to a speech of a near-end talker; emitting, by the first microphone, a first microphone signal, wherein the first microphone signal includes a second linear portion corresponding to the speech component of the collected second audio, the second linear portion associated with a second energy value; determining whether an energy value associated with the second linear portion of the first microphone signal satisfies one or more criteria; and revising, responsive to the determination, the energy value of the linear portion of the first signal, wherein the loudspeaker component is configured to emit audio at a volume in accordance with the energy value of the linear portion of the first signal.

B. The method of example A, wherein the second audio further includes an ambient component corresponding to near-end ambient sound, and the first microphone signal further includes a non-linear portion corresponding to the near-end ambient component; and further comprising: computing whether the energy value associated with the non-linear portion of the microphone signal satisfies one or more other criteria; and revising, responsive to the computation, the energy value of the linear portion of the first signal.

C. The method of example A or B, wherein determining whether the energy value associated with the first linear portion of the first microphone signal satisfies one or more criteria comprises determining whether a current energy value associated with the first linear portion exceeds a predetermined threshold.

D. The method of any one of examples A-C, wherein the current energy value associated with the first linear portion corresponds to an increase in volume of the speech.

E. The method of any one of examples A-D, wherein the current energy value corresponds to a sound volume of 73 decibels or greater.

F. The method any one of examples A-E, wherein the current energy value corresponds to a sound volume of 76 decibels.

G. A conferencing endpoint, the conferencing endpoint comprising: a transceiver unit; a loudspeaker coupled to the transceiver unit; a microphone coupled to the transceiver unit and the loudspeaker; and one or more processing units coupled to the transceiver unit, the loudspeaker, and the microphone; at least one non-transitory memory unit storing instructions executable by the one or more processing units, the instructions comprising instructions to: receive a first signal from a remote endpoint using the transceiver unit, the first signal including a first linear portion associated with a first energy value; emit first audio using the loudspeaker, the first audio based on the first signal; collect second audio using the microphone, wherein the second audio includes a speech component corresponding to a speech of a near-end talker; emit, using the microphone, a first microphone signal, wherein the microphone signal includes a second linear portion corresponding to the speech component of the collected second audio, the second linear portion associated with a second energy value; determine whether the second energy value associated with the second linear portion of the microphone signal satisfies one or more criteria; and revise, responsive to the determination, the energy value of the linear portion of the first signal, wherein the loudspeaker is configured to emit audio at a volume in accordance with the energy value of the linear portion of the first signal.

H. The conferencing endpoint of example G, wherein the second audio further includes an ambient component corresponding to near-end ambient sound, and the microphone signal further includes a non-linear portion corresponding to the near-end ambient component; and further comprising: computing whether the energy value associated with the non-linear portion of the microphone signal corresponding to the near-end ambient component satisfies one or more other criteria; and revising, responsive to the computation, the energy value of the linear portion of the first signal.

I. The conferencing endpoint of example G or H, wherein determining whether the energy value associated with the first linear portion of the microphone signal satisfies one or more criteria comprises determining whether a current energy value associated with the first linear portion exceeds a predetermined threshold.

J. The conferencing endpoint of any one of examples G-I, wherein the current energy value associated with the first linear portion corresponds to an increase in volume of the speech.

K. The conferencing endpoint of any one of examples G-J, wherein the current energy value corresponds to a sound volume of 73 decibels or greater.

L. The conferencing endpoint of any one of examples G-K, wherein the current energy value corresponds to a sound volume of 76 decibels.

M. A non-transitory computer readable medium storing instructions executable by one or more processors to adaptively control loudspeaker volume at a conferencing endpoint, wherein the instructions comprise instructions to: receive a first signal from a remote endpoint, the first signal including a first linear portion associated with a first energy value; emit first audio at a loudspeaker, the first audio based on the first signal; collect second audio using a first microphone, wherein the second audio includes a speech component corresponding to a speech of a near-end talker; emit, using the first microphone, a first microphone signal, wherein the first microphone signal includes a second linear portion corresponding to the speech component of the collected second audio, the second linear portion associated with a second energy value; determine whether an energy value associated with the second linear portion of the first microphone signal satisfies one or more criteria; and revise, responsive to the determination, the energy value of the linear portion of the first signal, wherein the loudspeaker component is configured to emit audio at a volume in accordance with the energy value of the linear portion of the first signal.

N. The non-transitory computer readable medium of example M, wherein the second audio further includes an ambient component corresponding to near-end ambient sound, and the first microphone signal further includes a non-linear portion corresponding to the near-end ambient component; and the instructions further comprise instructions to: compute whether the energy value associated with the non-linear portion of the microphone signal satisfies one or more other criteria; and increase, responsive to the computation, the energy value of the linear portion of the first signal.

O. The non-transitory computer readable medium of example M or N, wherein determining whether the energy value associated with the first linear portion of the first microphone signal satisfies one or more criteria comprises determining whether a current energy value associated with the first linear portion exceeds a predetermined threshold.

P. The non-transitory computer readable medium of any one of examples M-O, wherein the current energy value associated with the first linear portion corresponds to an increase in volume of the speech.

Q. The non-transitory computer readable medium of any one of examples M-P, wherein the current energy value corresponds to a sound volume of 73 decibels or greater.

R. The non-transitory computer readable medium of any one of examples M-Q, wherein the current energy value corresponds to a sound volume of 76 decibels.

The foregoing description of preferred and other embodiments is not intended to limit or restrict the scope or applicability of the inventive concepts conceived of by the Applicants. In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

The invention claimed is:

1. A method of adaptively controlling loudspeaker volume at a conferencing endpoint, the method comprising:
   receiving a first signal from a remote endpoint, the first signal having a first level;
   performing gain control on the first level of the first signal to produce an output signal having an output level;
   emitting first audio at a loudspeaker component, the first audio based on the output signal, the loudspeaker component emitting the first audio at a volume in accordance with the output level of the output signal;
   collecting second audio using a first microphone, wherein the second audio includes a speech component corresponding to a speech of a near-end talker and an ambient noise component;
   emitting, by the first microphone, a first microphone signal, wherein the first microphone signal includes a second speech portion corresponding to the speech component of the collected second audio and an ambient noise portion corresponding to the ambient noise component of the collected second audio, the second speech portion having a second speech level and the ambient noise portion having an ambient noise level;
   determining whether the second speech level of the second speech portion of the first microphone signal has increased, decreased or stayed the same;
   determining whether the ambient noise level of the ambient noise portion of the first microphone signal has increased, decreased or stayed the same; and
   revising the gain control performed on the first level of the first signal to produce the output signal at the output level responsive to the determination whether the second speech level increased, decreased or stayed the same and the determination whether the ambient noise level increased, decreased or stayed the same, the gain increased by a first increase level if the ambient noise level has increased and the second speech level has stayed the same, the gain increased by a second increase level higher than the first increase level if the ambient noise level has increased and the second speech level has increased, the gain decreased by a first decrease level if the ambient noise level has decreased and the second speech level has stayed the same, and the gain decreased by a second decrease level higher than the first decrease level if the ambient noise level has decreased and the second speech level has decreased.

2. The method of claim 1, wherein the amount of the first decease level is less than the amount of the first increase level.

3. The method of claim 1, further comprising leaving the gain control performed on the first level of the first signal to produce the output signal at the output level unchanged if the ambient noise level has stayed the same and the second speech level has stayed the same.

4. The method of claim 1, further comprising leaving the gain control performed on the first level of the first signal to produce the output signal at the output level unchanged if the ambient noise level has stayed the same and the second speech level has increased or decreased.

5. A conferencing endpoint, the conferencing endpoint comprising:
   a transceiver unit;
   a loudspeaker component coupled to the transceiver unit, the loudspeaker component for emitting first audio at a volume in accordance with the output level of an output signal;
   a microphone coupled to the transceiver unit and the loudspeaker, the microphone for collecting second audio, wherein the second audio includes a speech component corresponding to a speech of a near-end talker and an ambient noise component, the microphone for emitting a first microphone signal, wherein the first microphone signal includes a second speech portion corresponding to the speech component of the collected second audio and an ambient noise portion corresponding to ambient noise component of the collected second audio, the second speech portion having a second speech level and the ambient noise portion having an ambient noise level;
   one or more processing units coupled to the transceiver unit, the loudspeaker, and the microphone; and
   at least one non-transitory memory unit storing instructions executable by the one or more processing units, the instructions comprising instructions to:
   receive a first signal from a remote endpoint using the transceiver unit, the first signal having a first level;
   perform gain control on the first level of the first signal to produce an output signal having an output level;
   determine whether the second speech level of the second speech portion of the first microphone signal has increased, decreased or stayed the same;
   determine whether the ambient noise level of the ambient noise portion of the first microphone signal has increased, decreased or stayed the same; and
   revise the gain control performed on the first level of the first signal to produce the output signal at the output level responsive to the determination whether the second speech level increased, decreased or stayed the same and the determination whether the ambient noise level increased, decreased or stayed the same, the gain increased by a first increase level if the ambient noise level has increased and the second speech level has stayed the same, the gain increased by a second increase level higher than the first increase level if the ambient noise level has increased and the second speech level has increased, the gain decreased by a first decrease level if the ambient noise level has decreased and the second speech level has stayed the same, and the gain decreased by a second decrease level higher than the first decrease level if the ambient noise level has decreased and the second speech level has decreased.

6. The conferencing endpoint of claim 5, wherein the amount of the first decease level is less than the amount of the first increase level.

7. The conferencing endpoint of claim 5, wherein the instructions further comprise instructions to leave the gain control performed on the first level of the first signal to produce the output signal at the output level unchanged if the ambient noise level has stayed the same and the second speech level has stayed the same.

8. The conferencing endpoint of claim 5, wherein the instructions further comprise instructions to leave the gain control performed on the first level of the first signal to produce the output signal at the output level unchanged if the ambient noise level has stayed the same and the second speech level has increased or decreased.

9. A non-transitory computer readable medium storing instructions executable by one or more processors to adaptively control loudspeaker volume at a conferencing endpoint based on a first microphone signal emitted by a first microphone, the loudspeaker for emitting first audio at a volume in accordance with the output level of an output signal and the first microphone for collecting second audio which includes a speech component corresponding to a speech of a near-end talker and an ambient noise component and for emitting the first microphone signal, wherein the first microphone signal includes a second speech portion corresponding to the speech component of the collected second audio and an ambient noise portion corresponding to ambient noise component of the collected second audio, the second speech portion having a second speech level and the ambient noise portion having an ambient noise level, wherein the instructions comprise instructions to:

receive a first signal from a remote endpoint, the first signal having a first level;

perform gain control on the first level of the first signal to produce an output signal having an output level;

determine whether the second speech level of the second speech portion of the first microphone signal has increased, decreased or stayed the same;

determine whether the ambient noise level of the ambient noise portion of the first microphone signal has increased, decreased or stayed the same; and revise the gain control performed on the first level of the first signal to produce the output signal at the output level responsive to the determination whether the second speech level increased, decreased or stayed the same and the determination whether the ambient noise level increased, decreased or stayed the same, the gain increased by a first increase level if the ambient noise level has increased and the second speech level has stayed the same, the gain increased by a second increase level higher than the first increase level if the ambient noise level has increased and the second speech level has increased, the gain decreased by a first decrease level if the ambient noise level has decreased and the second speech level has stayed the same, and the gain decreased by a second decrease level higher than the first decrease level if the ambient noise level has decreased and the second speech level has decreased.

10. The non-transitory computer readable medium of claim 9, wherein the amount of the first decease level is less than the amount of the first increase level.

11. The non-transitory computer readable medium of claim 9, wherein the instructions further comprise instructions to leaving the gain control performed on the first level of the first signal to produce the output signal at the output level unchanged if the ambient noise level has stayed the same and the second speech level has stayed the same.

12. The non-transitory computer readable medium of claim 9, wherein the instructions further comprise instructions to leaving the gain control performed on the first level of the first signal to produce the output signal at the output level unchanged if the ambient noise level has stayed the same and the second speech level has increased or decreased.

* * * * *